(12) United States Patent
Heintel et al.

(10) Patent No.: US 8,578,307 B2
(45) Date of Patent: Nov. 5, 2013

(54) CONTROL/MONITOR AUTOMATION FOR ASICS AND PROGRAMMABLE LOGIC

(75) Inventors: James Heintel, Kent, OH (US); Jane Smith, Akron, OH (US)

(73) Assignee: ViaSat, Inc., Carlsbad, CA (US)

( * ) Notice: Subject to any disclaimer, the term of this patent is extended or adjusted under 35 U.S.C. 154(b) by 567 days.

(21) Appl. No.: 12/883,581

(22) Filed: Sep. 16, 2010

(65) Prior Publication Data
US 2011/0067001 A1 Mar. 17, 2011

Related U.S. Application Data

(60) Provisional application No. 61/243,129, filed on Sep. 16, 2009.

(51) Int. Cl.
*G06F 17/50* (2006.01)
(52) U.S. Cl.
USPC .......................... 716/104; 716/111; 716/116
(58) Field of Classification Search
USPC ......................................... 716/104, 111, 116
See application file for complete search history.

(56) References Cited

U.S. PATENT DOCUMENTS 6,449,715 B1 * 9/2002 Krivoshein ...................... 713/1

* cited by examiner

*Primary Examiner* — Thuan Do
(74) *Attorney, Agent, or Firm* — Kilpatrick Townsend & Stockton LLP

(57) ABSTRACT

Systems and methods for automated control/monitoring code development for ASICs and PLDs are provided. Control/monitor structures associated with a module may be inputted into a standard specification file. One or more default configurations for each control/monitor structure may also be inputted into the specification file. Fields of the specification file may be automatically populated or updated in response to user input in another field, and input and consistency errors may be automatically detected and/or corrected. After a request to build a module is received, one or more source or header output files may be automatically generated using information from the specification file. Automatically generated documentation may also be inserted into the output files, and links may be generated to and from hardware specifications and programmer's manuals.

23 Claims, 11 Drawing Sheets

200

| Offset (hex) | Cfg Name | Field Name | MSB | LSB | Access Type | Description | Reset Value/Mem Size | Field Bit Count | Module Name | Error Msgs | Default Config |
|---|---|---|---|---|---|---|---|---|---|---|---|
| 0 | Revision | | | | | Externally tied to a revision number | | | | | |
| | | value | 15 | 0 | RO | Revision number | | 16 | | | |
| 2 | agc | | | | | General control bits for analog gain control | | | | | |
| | | en | 0 | 0 | RW | 1 enables, 0 resets | all 0 | 1 | | | |
| | | hold | 1 | 1 | RW | 1 holds all flip flops 0 allows updates | all 0 | 1 | | | |
| | | bypass | 2 | 2 | RW | 1 bypasses AGC output | all 0 | 1 | | | |
| | | freeze | 3 | 3 | RW | 1 freezes PI Control update | all 0 | 1 | | | |
| | | blk-avg | 5 | 4 | RW | Block average length select | all 0 | 2 | | | |
| | | | 15 | 6 | RSV | unimplemented | | 10 | | | |
| 4 | agc-integral | | | | | PI loop gain | | | | | |
| | | gain | 13 | 0 | | Integral gain | all 0 | 14 | | | |
| 6 | scratch | | | | | Scratch pad used for test or by software | | | | | |
| | | pad | 15 | 0 | RW | | all 0 | 10 | | | |

| Offset (hex) | Cfg Name | Description | Module Name | Row # |
|---|---|---|---|---|
| 0 | Revision | Externally tied to a revision number | Top_ana | 2 |
| 2 | | General control bits for analog gain control PI loop gain | | 4 |
| 4 | | PI loop gain | | 11 |
| 6 | | Scratch pad used for test or by software | | 13 |

```
//------------------------------------------------------------
// row 6 - - "agc" - - General control bits for the Analog Gain control block
//------------------------------------------------------------ output [`TOP_ANA_AGC_EN_FIELD_RNG]      Z_RW_agc_en,      //'1' enables ...
output [`TOP_ANA_AGC_HOLD_FIELD_RNG]    Z_RW_agc_hold,    //'1' holds ...
```
402

410

```
//------------------------------------------------------------
// row 6 - - "agc" - - General control bits for the Analog Gain control block
//------------------------------------------------------------

...
    reg [`TOP_ANA_AGC_EN_FIELD_RNG]      agc_en_r;
    reg [`TOP_ANA_AGC_HOLD_FIELD_RNG]    agc_hold_r;
...

// RW fields generate flip-flops
    Always @ (posedge Clock or negedge Reset_n) begin
        If (Reset_n == 1'b0) begin
            agc_en_r                          <= `TOP_ANA_AGC_EN_RESET;
            agc_hold_r                        <= `TOP_ANA_AGC_HOLD_RESET;
...
        end
        else if (wr_cycle & (APB_addr == `TOP_ANA_AGC_OFFSET)) begin
            agc_en_r                          <= APB_wdata[`TOP_ANA_AGC_EN_CFG_RNG];
            agc_hold_r                        <= APB_wdata[`TOP_ANA_AGC_HOLD_CFG_RNG];
...
        end
```
412

| Offset (hex) | Cfg Name | Field Name | MSB | LSB | Access Type | Description | Reset Value/Mem Size | Field Bit Count | Error Msgs | Default Config |
|---|---|---|---|---|---|---|---|---|---|---|
| . . . 6 | IRQ_SRC_<a> | | | | | Source register in a lowest level interrupt set | | | | |
| | | IRQ | 6 | 0 | RO | The IRQ that is fed to next level | | 1 | | |
| | | <src 1> | 1 | 1 | W1C | <describe src 1> | | 1 | | |
| | | <src 2> | 2 | 2 | W1C | <describe src 2> | | 1 | | |
| | | | 15 | 3 | RSV | unimplemented | | 13 | | |
| 8 | IRQ_EN_<a> | | | | | Interrupt masks for source register 1 enables 0 masks | | | | |
| | | IRQ | 0 | 0 | RW | 0 masks this register set | all 0 | | | |
| | | <src 1> | 1 | 1 | RW | 0 prevents corr. bit in source reg. from feeding into IRQ | all 0 | | | |
| | | <src 2> | 2 | 2 | RW | 0 prevents corr. bit in source reg. from feeding into IRQ | all 0 | | | |
| | | | 15 | 3 | RSV | unimplemented | | | | |
| | IRQ_PENDING . . . | | | | | Shows gating of previous IRQ_SRC bits and masks in IRQ_EN | | | | |
| | IRQ_HALT . . . | | | | | Enable output halt bit to stop external circuitry for debug | | | | |
| | IRQ_FORCE . . . | | | | | Force source bit to be set for testing | | | | |

CONTROL/MONITOR AUTOMATION FOR ASICS AND PROGRAMMABLE LOGIC

CROSS-REFERENCES TO RELATED APPLICATIONS

This claims benefit of priority under 35 U.S.C. §119(e) of U.S. Provisional Application No. 61/243,129, filed on Sep. 16, 2009, entitled "Control/Monitor Automation for ASICs and Programmable Logic," the entirety of which is herein incorporated by reference for all purposes.

BACKGROUND OF THE INVENTION

This invention relates generally to application-specific integrated circuits (ASICs) and programmable logic device (PLD), and more particularly to systems and methods for automated control/monitoring code generation for ASICs and PLDs.

Continuing advances in semiconductor technology have made the integration of increasingly complex functionality possible on a single chip. Single chips are now capable of performing the functions of entire multi-chip systems of years past. For example, today's system-on-a-chip (SoC) may include millions of gates and perform numerous digital, analog, and mixed-signal functions supporting, for example, an embedded system—all on a single substrate.

Typical SoC designs include a controller core (e.g., a microcontroller, microprocessor, or digital signal processor (DSP) core), memory blocks (e.g., ROM, RAM, EEPROM, flash, and hybrid types of memory), peripherals (e.g., counters, timers, and power-on reset generators), and external interfaces all connected by either a proprietary or industry-standard bus. Direct memory access (DMA) controllers may route data directly between the external interfaces and the memory blocks bypassing the controller core. In addition to the hardware described above, an SoC also typically includes associated software that controls the controller core, peripherals, and interfaces. While providing new opportunities, increasingly complex SoCs pose new challenges to the system designer. In particular, conventional design and verification methodologies are often unacceptably time-consuming for large SoC's.

Integrated circuits containing programmable logic, such as field-programmable gate array (FPGAs), are designed to be configured or programmed by a consumer or designer after manufacture of the integrated circuit. PLDs can generally be used to implement any logical function that an ASIC can perform, but the PLD is typically more attractive for some applications due to the ability to update or change the functionality of the PLD after shipping, partial reconfiguration of a portion of the design, and the low non-recurring engineering costs relative to an ASIC design. Today's PLDs, like their ASIC counterparts, may include millions of gates and perform numerous logical functions.

Designers of both PLDs and ASICs may formally describe the digital logic using a hardware description language (HDL), such as VHDL or Verilog. The HDL may be used to describe the circuit's operation, its design and organization, and may also be used to verify its operation by means of simulation. For example, in order to verify that a given HDL design performs correctly, it is common to build a behavioral (e.g., functional) model or logic simulation of the circuit in a software language such as C or C++. The results of the software model or simulation are then compared against those of the HDL model. The software and HDL model must be kept consistent with each other throughout design changes, and changes to one model must be reflected in the other. Making such changes is typically time-consuming and a largely manual process that increases the chance of introducing inconsistencies between the two models. The complexity of making such changes increases if large teams of engineers are involved in the design process.

In addition, modern SoC, ASIC and PLD designs often have hundreds or even thousands of on-chip registers that are used to configure the device for different modes of operation. These memory elements play a critical role in the proper functioning of the device and must be thoroughly verified prior to tape-out. Register verification is becoming an increasingly complex and challenging task. Register specifications, including, for example, address ranges, reset values, and access modes, may change throughout the design process. These changes must be propagated throughout the verification environment and the various test bench components. Updating the test bench every time a single register is added, a field is changed, or a memory is modified becomes a very time-consuming task. In addition, manual approaches to register verification can easily miss errors or bugs, especially as the number of registers to be verified increases.

Moreover, documentation is often not created for the control, monitor, or configuration portions of an ASIC or PLD until very late in the system development cycle. Multiple designers may also develop similar logic differently so that there is typically no standardized way to implement common functions and little consistency between designs. In addition, changes to the logical design of the system may occur frequently, be very time-consuming to implement, and are often not effectively incorporated into the documentation.

Documentation, if any exists, may also become poorly matched with the HDL code and simulation/control software over time. This may result in hidden fields and hidden side effects that are not documented or documented very poorly. These hidden fields and hidden side effects often make use and debugging of the system very frustrating and time consuming.

BRIEF SUMMARY OF THE INVENTION

In view of the foregoing, systems and methods for automated control and monitoring code development for ASICs and PLDs are provided. Control and monitor structures associated with a module may be inputted into a standard specification file. One or more default configurations for each control or monitor structure may also be inputted into the specification file. Fields of the specification file may be automatically populated or updated in response to user input in another field, and input and consistency errors may be automatically detected, corrected, or both. After a request to build a module is received, one or more source or header files may be automatically generated using information from the specification file. The automatically generated source or header files may take the form of register transfer level (RTL) abstraction code, such as HDL modules, HDL instantiation files, design verification files, and HDL headers, software headers, or any other type of design, control, monitor, or simulation code or programs. The default configuration values included in the specification file may also be used in the code generation process in order to, for example, program the device to support one or more default modes of operation.

In some embodiments, documentation may be created in the form of automatically generated comments in the source and header files in response to receiving a request to build a module. References to specific rows in the specification file may be inserted into the documentation. In addition, links to portions of the specification may be inserted into externally-generated documentation, such as a programmer's manual or hardware specification document.

In some embodiments, documentation may also be automatically posted to a corporate wiki or bulletin board in response to receiving the request to build a module. Posts may include links to portions of data in the specification file, links to portions of automatically-generated code (e.g., automatically-generated comments), or both.

The specification files of the present invention may support multiple types of control/monitor structures. Some of these structures may include, for example, software programmable control, configuration, and status registers, ports for software monitoring, decode ports for external memory access, memory interfaces, interfaces supporting designer-defined side effects, any other host interfaces, and interrupt registers. Each field of a control/monitor structure may be associated with, among other attributes, a field name, an access type, a detailed description, a field bit count, a default reset value, and one or more optional default configurations.

In some embodiments, the specification file may be at least partially template-driven or macro-driven. Templates or macros may be used to quickly insert new control/monitor structures, insert new fields, remove structures and fields, reset a field to default values, or correct a field with invalid entries. In addition, some structures may be inserted into the specification file using a template or macro. For example, a template or macro may be used to automatically insert a set of interrupt request (IRQ) registers into the specification file.

In some embodiments, the specification files supports IRQs that are fed up to the host based on a set of interrupt registers and logic trees. IRQ bits may be combined as needed at lower levels in order to create a single resultant IRQ to the host. The IRQs supported by the specification file may allow for visibility into the source of an interrupt, clearing of an interrupt, masking of an interrupt, halting of external hardware based on an interrupt, and forcing an interrupt (e.g., for design verification or software testing). Templates or macros may be used to automatically insert the required interrupt registers for the lowest level interrupts and higher level interrupts into the specification file.

In some embodiments, a revision register is included in the specification file. The revision register may be read by software in order to determine which revision or build of the module is being used. The revision register may be tied to a vendor's build (e.g., for PLDs), in some embodiments, or may include an indication of which signed off netlist was used (e.g., for ASICs) to create the device. In some embodiments, the revision register may be automatically populated based on the time the module was built and/or the corresponding module code was generated.

In some embodiments, a first user input defining a first programmable structure of a device may be received, the first user input including at least one of a structure name and a structure description. A second user input defining a field of the first programmable structure and at least one default configuration value for the field may also be received. A third user input defining an access type for the field may also be received. A request to build a module including the first programmable structure may then be received. In response to receiving the request to build the module, at least one register transfer level (RTL) file may be automatically generated based at least in part on the first user input, the second user input, and the third user input. An output mapping of register address to default configuration value for the field of the first programmable structure may also be automatically generated. In response to receiving the request to build the module, the device may also be automatically programmed to support one or more default modes of operation using the output mapping.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label with a dash and a second label that distinguishes among the similar components. If only the first reference label is used in the specification, the description is applicable to any one of the similar components having the same reference label irrespective of the second reference label.

FIG. 2 shows a data table of an illustrative specification file in accordance with one embodiment of the present invention;

FIG. 3 shows a data table of an illustrative memory map file in accordance with one embodiment of the present invention;

FIG. 4 shows illustrative code generated in accordance with one embodiment of the present invention;

FIG. 8 shows a data table of an illustrative specification file in accordance with one embodiment of the present invention;

DETAILED DESCRIPTION OF THE INVENTION

Systems and methods for automated control/monitor code generation for ASICs and PLDs are provided. An automated configuration tool ("ACT") allows a user to input control/monitor structures into a specification file and use these inputted structures to automatically generate code and related documentation that is consistent and up-to-date with the current revision or build of the module. Each specification file may include control/monitor structures relating to a single module or multiple modules. In some embodiments, the control/monitor structures may correspond to programmable structures of the ASIC or PLD. Some of these programmable structures may include, for example, software programmable control, configuration, and status registers, ports for software monitoring, decode ports for external memory access, memory interfaces, interfaces supporting designer-defined side effects, any other host interfaces, and interrupt registers.

Figure 1:
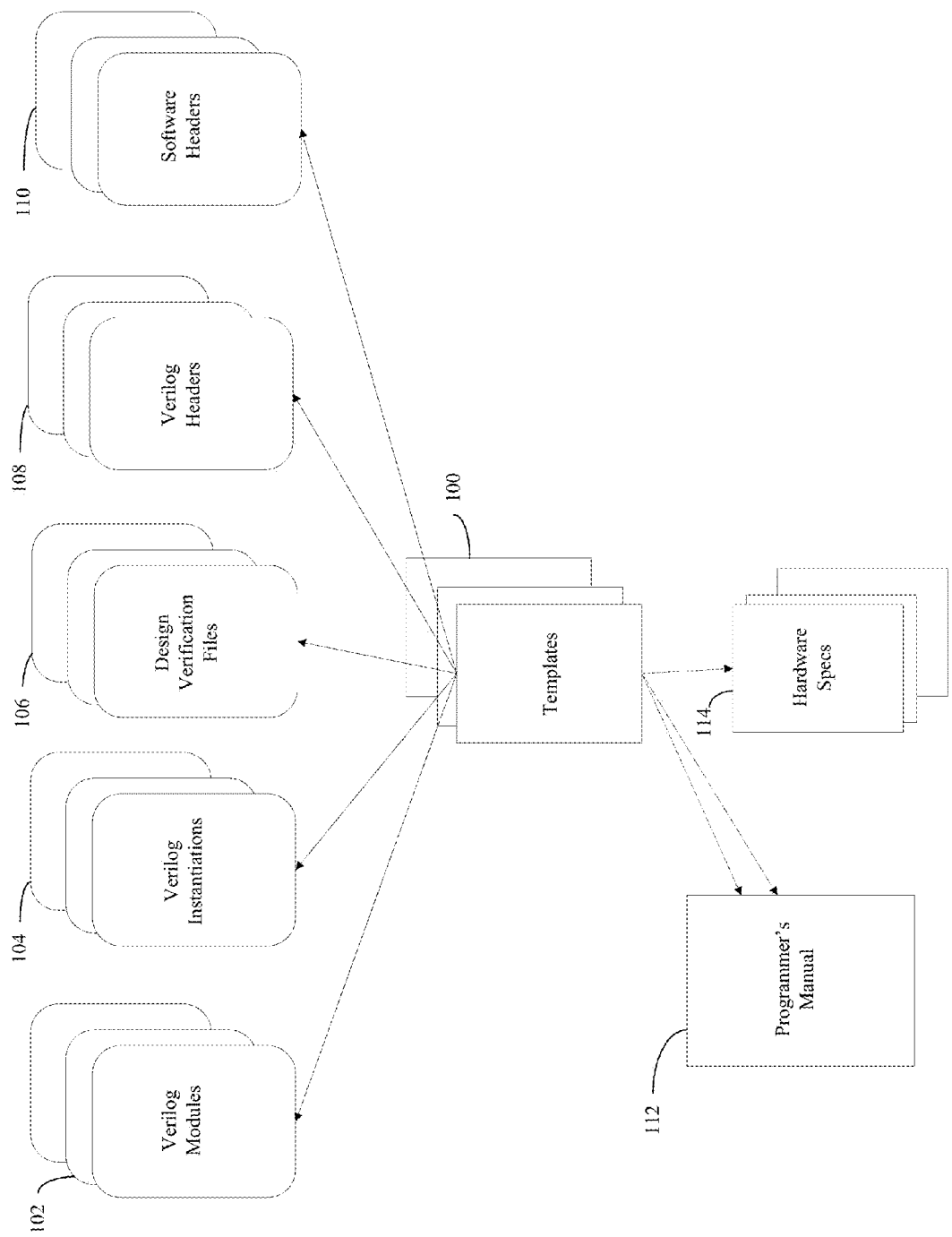
FIG. 1 is a simplified block diagram of an illustrative automation system in accordance with one embodiment of the present invention.

FIG. 1 shows an illustrative automation system in accordance with one embodiment of the present invention. Specification file 100 may take the form of a template file, spreadsheet, or other graphical user interface (GUI) for inputting information relating to control/monitor structures associated with a given module. As discussed above, the structures inputted into specification file 100 may then be used to configure a device (e.g., an ASIC or PLD) in a consistent and efficient manner. Specification file 100 may include, for example, register and memory specifications for a single module or multiple modules of a device.

In some embodiments, specification file 100 includes one or more tabbed worksheets (e.g., Microsoft Excel worksheets) of a spreadsheet (e.g., a Microsoft Excel spreadsheet) with predefined macros for performing common functionality. For example, one or more of the macros defined in Table 1 may be supported by specification file 100. Each macro may be associated with a keyboard shortcut that quickly executes the macro.

TABLE 1

Illustrative macros supported by the specification file.

| Macro Name | Functionality |
| --- | --- |
| "insert_cfg_row" | This macro may be used to insert a row in the configuration worksheet for a new control/monitor structure. The macro may insert a row above the currently selected cell, add all the correct default information, and fix rows above and below the inserted row due to the insert. |
| "insert_multiple_cfg_rows" | This macro may be used to insert multiple rows in the configuration worksheet using the "insert_cfg_row" macro based on a user input for the number of rows to be inserted. |
| "delete_cfg_row" | This macro may be used to delete a row on the configuration worksheet. The macro may delete the row containing the currently selected cell, and fix rows above and below the deleted row due to the delete. |
| "reset_cfg_row" | This macro may be used to reset a row with default values and calculations. This macro may overwrite user-entered data in order to restore all the default values/equations. |
| "insert_IRQ_lowest" | This macro may be used to add a set of low level IRQ registers with template information (e.g., source, enable, pending, halt, and force registers). |
| "insert_IRQ_high" | This macro may be used to add a set of higher level IRQ registers with template information (e.g., IRQ, enable, and pending registers). |
| "fix_cfg_row" | This macro may be used to fix a row showing problems with the auto-calculations. |
| "fix_multiple_cfg_rows" | This macro may be used to request input from the user for a first and last rows to fix. For example, the entire specification file may be fixed using this macro. |
| "create_map" | This macro may be used from anywhere within the specification file and may create a memory address map "addr_map" worksheet from information in the configuration worksheet. |
| "build_modules" | This macro may open a shell command prompt and build auto-generated code for all modules specified in the current configuration worksheet. |

One of the tabbed worksheets may include a configuration worksheet where control/monitor structures are inputted by a user. An illustrative configuration worksheet is shown in more detail in FIG. 2. Several other tabbed worksheets may be defined, including a memory map worksheet (shown in more detail in FIG. 3), and a "setup" worksheet for setting common configuration parameters and variables used by specification file 100. For example, some common configuration parameters that may be edited by a user may include the data width or maximum number of bits per configuration register and the minimum delta for memory address offsets.

A spreadsheet or workbook interface for specification file 100 may be advantageous in some embodiments for many reasons. For example, certain spreadsheet columns or cells may be configured to be automatically populated when data is entered into another column or cell. As described in more detail below, equations referencing other cells in the same or different worksheets may be tied to individual columns or cells within a column. In this way, a template may be created for efficient user input. Cells may be automatically populated as soon as sufficient information in other cells is inputted by the user (or automatically calculated by the equations included in the specification file). In addition, a spreadsheet or workbook interface may support automatic error checking in the form of cell input verification, cell format verification, and custom user-defined or system-defined error checking. For example, as described in more detail below, a column or columns dedicated to error messages may be included in specification file 100. As a user inputs data into specification file 100, common data entry and data consistency errors may be automatically detected by, for example, tying conditional statements to the error column or column. Simple or complex logic may be used in conjunction with the conditional statements in order to provide a robust error-checking environment, thus minimizing wasted time debugging RTL files, software models, or simulation code.

A spreadsheet or workbook interface may also provide many other advantages. For example, macros may be used to automatically run scripts via, for example, a command-line interpreter. Other useful features may include the pre-population of typical default values in one or more columns or cells of specification file 100. In addition, in-line help may be provided in the form of commented columns, cells, and fields so that when a user positions a cursor over a cell for data entry, helpful information pertaining to the appropriate input for that cell may be automatically displayed.

Specification file 100 may also include in-line help in the form of commented fields and tabbed help worksheets providing detailed instructions on how to input data into specification file 100, how to fix common problems, how generate a build, and how to perform other related error-checking. One tabbed worksheet included in specification file 100 may describe each column of the configuration worksheet and another tabbed worksheet may provide a working example of a sample configuration worksheet to assist users in entering actual data into the actual configuration worksheet. Other forms of integrated help for data entry may include other special help worksheets that a user may quickly access from one or more tabs positioned at the periphery of the configuration worksheet.

Although some of the embodiments described herein refer to a Microsoft Excel spreadsheet or worksheet specification file, any other type of spreadsheet, database management system, or GUI may be used in other embodiments. For example, a standalone application or program running on a host computer may be used to input control/monitor structures into specification file 100. In some embodiments, control/monitor structures may be inputted remotely over a network (e.g., a private intranet, extranet, or the Internet) using a web-enabled database management system or website. A host computer may receive the user input, execute a build command to generate documentation and code, and deliver the documentation, code, or both back to the remote user.

As described above, specification file 100 may define multiple configuration registers, ports, memory interfaces, and interrupts to support successful programming of an ASIC or PLD. One register that may be included in the configuration worksheet of specification file 100 is the "revision" register. This register may be the first register in every specification file and may include some indication of the current build number. In a PLD, one ideal value for the revision register may include a number tied to the PLD vendor's build. In an ASIC, one ideal value for the revision register may include a value that indicates which signed off netlist was used to create the device. In some embodiments, the revision register may be automatically populated based on the time the module was built and/or the corresponding module code was generated.

After all the desired control/monitor structures are inputted into specification file 100, a user command to build a module may be received. For example, the "build_modules" macro may be executed using a keyboard shortcut from the host computer (or remotely over a network). In response to receiving the user command to build modules, one or more scripts may be executed. In some embodiments, the scripts may open an operating system command prompt or command line interpreter and execute a series of build commands. For example, Perl scripts may be used in some embodiments. These Perl scripts may execute, for example, from within a Microsoft DOS command prompt. Any other scripting language and any other operating system command prompt or command line interpreter may be used in other embodiments.

The scripting language may execute a script that builds several different types of code and documentation. In the example of FIG. 1, one or more of Verilog module files 102, Verilog instantiation files 104, design verification files 106, Verilog headers 108, and software headers 110 may be automatically generated. In other embodiments, more or fewer types of documentation and code may be automatically generated in response to receiving a build module command. In addition to the files shown in FIG. 1, an example software program of how to use software header 110 may be generated. For example, as describe in more detail in FIG. 10, below, an example program that outputs some or all of the default configuration registers may be generated as an example of how to use software header 110. Additional programs, such as software models (e.g., to compare to HDL models) or test simulations may be automatically generated. The software code may be generated in any suitable language, such as C/C++, Java, or Visual Basic. In addition, although Verliog modules, headers, and instantiation files are referred to in the example of FIG. 1, any type of HDL headers, modules, and instantiation files may be automatically generated in other embodiments (e.g., VHDL, AHDL, AHPL, JHDL, or MyHDL files).

Some or all of the files automatically generated by the scripting language may include useful documentation in the form of detailed comments. Some of these comments may reference specification file 100. For example, if a particular configuration register appears at a particular row of the configuration worksheet of specification file 100, comments referencing that particular row or line number and its associated detailed description may be automatically inserted into Verilog module files 102, Verilog instantiation files 104, design verification files 106, Verilog headers 108, and software headers 110. In this way, a designer can easily map or trace code to the configuration specifications included in specification file 100.

In some embodiments, in response to receiving a command to build a module, links may be created to portions of specification file 100 in programmer's manual 112 and hardware specifications 114. For example, hyperlinks may be added or updated in HTML versions of these documents. The links may help programmers and system designers studying programmer's manual 112 or hardware specifications 114 access the most current and accurate documentation for each build directly from these files. Links to programmer's manual 112 or hardware specifications 114 may also be inserted in specification file 100 itself so that system designers may quickly access related documentation directly from specification file 100.

FIG. 2 shows a sample configuration worksheet of a specification file (e.g., specification file 100 of FIG. 1). As described above, the specification file may take the form of a spreadsheet with tabbed worksheets in some embodiments. In other embodiments, a relational database with a series of linked database tables are used for the specification file. In still other embodiments, a stand-alone program or application implementing a GUI is used for the specification file.

Table 200 shows an illustrative configuration portion of a specification file. Column 202 may include the memory address offset (in hexadecimal notation) for each control/monitor structure. The minimum memory address delta used to compute the offsets in column 202 may be defined by a user in a "setup" worksheet included in the specification file. Some typical offset values may include 2 or 4 bytes, although any suitable value may be selected by the user. The offsets included in column 202 may be automatically populated each time a new control/monitor structure is inserted into the configuration worksheet (e.g., using the "insert_cfg_row" macro). In some embodiments, users may be permitted to manually edit and override the pre-populated values in column 202 in order to, for example, leave gaps in the address space if desired.

Column 204 may include a name for the control/monitor structure. Each name in column 204 may be unique for a given module. For example, as shown in FIG. 2, "agc" may be used as the name for a 16-bit configuration register controlling an analog gain control block. Each control/monitor structure may include one or more fields, each of which may be named (e.g., using a unique name or identifier for each control/monitor structure) in column 206. For example, configuration registers may include multiple fields each consisting of one or more bits of the register. Each field name within a control/monitor structure may be unique. In the example of the analog gain control register shown in FIG. 2, six fields are defined for the register. The field "en" may correspond to the enable flag, the field "hold" may correspond to whether or not updates are allowed, the field "bypass" may correspond to whether or not the analog gain control block's output should be bypassed and a software configured value selected, the field "freeze" may correspond to whether PI control updates are frozen, the field "blk_avg" may correspond to a block average length select value, and the unnamed 10-bit field may be unimplemented and reserved.

Columns 208 and 210 may include the most significant bit and least significant bit of each field, respectively. The values in columns 208 and 210 may be automatically calculated from other columns in table 200, including column 218 representing the field bit count. Column 212 may include an access type value for each field. A user may input an access type by selecting an access type from a drop-down list or menu. Common access types may be pre-defined in the "setup" worksheet and may include one or more the access types shown in Table 2 below.

TABLE 2

Illustrative field access types.

| Field Access Type | Description/Result |
| --- | --- |
| RW | Read/Write-Flip-flop(s) generated, under software control with output of flip-flops as an output port. |
| RO | Read Only-Software may not change the value directly, no flip-flop(s) generated, and a read port input is provided. |
| RSV | Reserved-The bit(s) in this field may not be implemented and may read back 0. |
| MEM | This access type allows software access to an external memory block in the configuration address space. The following ports may be provided: read-an output port that is active when the address space for the memory has an active read cycle; read data-an input port that may provide data that will be read by software; write data-an output port with data written by software; and write-an output port indicating a write cycle. |
| W1C | This field has a "side effect." It may generate a read port, a read signal, and a write signal if data is '1'. Some tools (e.g., Register Abstraction Layer (RAL) tools) may use this access type for configuration testing. |
| RC | The field has a "side effect." It may generate a read port and a signal indicating a read cycle. Some tools (e.g., RAL tools) may use this access type for configuration testing. |
| SE_RIWO | The field has a "side effect." Reading or writing may cause something else to happen in the hardware. Two specific cases include: clearing a field on a read (RC) and writing a 1 to clear (W1C). Since there are so many possible side effects, the scripts may generate ports to allow customized logic, providing maximum flexibility. |
| "R" | A single output bit, active high, may indicate that the location is being read. Any field with "R" set may cause one port to be created. |
| "I" | An input port the width of the field may be created. The value on the port is the value read by software. An error may be generated if "I" exists without "R". |
| "W" | A single output bit, active high, may indicate that the location is being written. Any field with "W" set may cause one port to be created. |
| "O" | An output port the width of the field may be created. The value on the port is the write data from the processor. It is a feed-through of the data, but is preferable to having the designer directly use the input to this module. The bit positions of the field may move due to revisions, and still have the logic be correct. |
| "SE_R---"<br>"SE_--W-"<br>"SE_R-W-" | These access types support traditional "side effects" for use with RW registers. In these cases, the RW registers may generate flip-flop(s), and the flip-flop(s) may be tested just like any other RW register. Hardware may only react when the register has been written. The individual lines may act as normal, but control signal(s) indicating read and/or write of the register may be output. |

Column 214 may include a reasonably detailed textual description for each control/monitor structure and each field within a control/monitor structure. For example, the contents of column 214 may describe "side effects" in detail to serve as a reference to other developers and designers. Typically, the description included in column 214 should be descriptive enough to give users of the block and programmers enough information to use the feature.

Column 216 may include a reset value or memory size for the field. If the access type is "RW" then this field may be set to, for example, specify that the reset value is all 1's, all 0's, some specified hexadecimal value ("hxx"), or some specified decimal value ("dxx"). If the access type is "MEM" then the memory depth may be included in column 216. For example, the memory depth may be represented as a decimal value and may be used to form the next offset value in column 202. In some embodiments, reset values may also be specified in column 216 for fields with access types other than "RW" but the designer may confirm that the external reset is properly configured and correct.

Column 218 may include the number of bits in each field. The values in column 218 may be used to automatically compute one or more of the most significant bit and least significant bit values in column 208 and 210, respectively. Column 220 may include a module name for the control/monitor structures. As mentioned above, a single specification file may include control/monitor structures for one or more modules. If a module name is provided in column 220, it may be provided on the first control/monitor structure line to be included in the module. If subsequent modules are to be defined, new module names may be entered in column 220 on subsequent control/monitor structure lines.

Column 222 may include error messages indicating an error in the row where the error message or messages appear. The scripts used to automatically generate code and/or documentation may catch additional errors, but column 222 may be provided to catch early formatting and data entry problems before building a module. Some examples of common errors may include invalid or missing description, too many field bits for control/monitor structure, not enough field bits for control/monitor structure, invalid or missing memory depth, and invalid or missing reset value. In some embodiments, the errors included in column 222 may include user input and consistency errors, while compile, runtime, parsing, and syntax errors may be handled by the scripts used to build the module. A series of conditional statements tied to column 222 may be used to automatically check for errors.

Column 224 may include one or more default configurations for the control/monitor structure used to program the device. Column 224 may actually take the form of one or more columns, each column indicating a different default configuration. This column may also be used to input a detailed description of a module (e.g., for lines including a module name). This detailed description may be used by the scripts during the module build and included as documentation within one or more output files (e.g., files 102, 104, 106, 108, and 110). If values are entered on the field lines in column 224, these values may be used to program the corresponding configuration register. In this way, one or more operating modes may be supported and documented in the specification file. Hexadecimal and decimal values may be supported in the same way as with column 216. Fields that have no write effect (e.g., read-only fields or fields with some side effect) may be left blank. In some embodiments, these fields may be written with a 0 (or the reset value), if they are writeable fields. Fields with a "MEM" access type may include a filename in column 224 in which default memory initialization values are stored for each default configuration.

The columns and values shown in FIG. 2 are merely illustrative. More or fewer columns may be included in actual implementations. In addition, as mentioned above, a single specification file may include multiple control/monitor structures for one or more modules.

FIG. 3 shows memory map table 300. Table 300 may be part of a specification file (e.g., specification file 100 of FIG. 1), for example, as a separate tabbed worksheet in a spreadsheet or workbook (e.g., the "addr_map" worksheet), or table 300 may be a stand-alone table apart from the specification file. Table 300 may include one or more of offset column 302, configuration name column 304, description column 306, module column 308, and row column 310. One or more of the columns in table 300 may be derived directly from the configuration worksheet (e.g., table 200 of FIG. 2) of a specification file. Table 300 may also be generated using a macro from anywhere within the specification file (e.g., the macro "create_map"). Table 300 may include useful register and memory configuration information for programmers and system designers. All or part of table 300 may be linked to one or more programmer's manuals or hardware specifications (e.g., programmer's manual 112 or hardware specifications 114) for easy access to register and memory configuration information.

Column 302 may be derived from column 202 of FIG. 2. Column 304 may be derived from column 204 of FIG. 2. Column 306 may be derived from column 214 of FIG. 2. Column 308 may be derived from column 220 of FIG. 2. Column 310 may include an indication of which row the control/monitor structure appeared in the associated configuration worksheet of the specification file. In this way, a programmer or designer may quickly reference the configuration worksheet in order to obtain more detailed, field-level information. In some embodiments, the entries in column 310 are linked to the corresponding row in the configuration worksheet using a hyperlink or other similar linking mechanism. A user may simply click on any entry in column 310 and automatically be presented with detailed information from the configuration worksheet.

Figure 10:
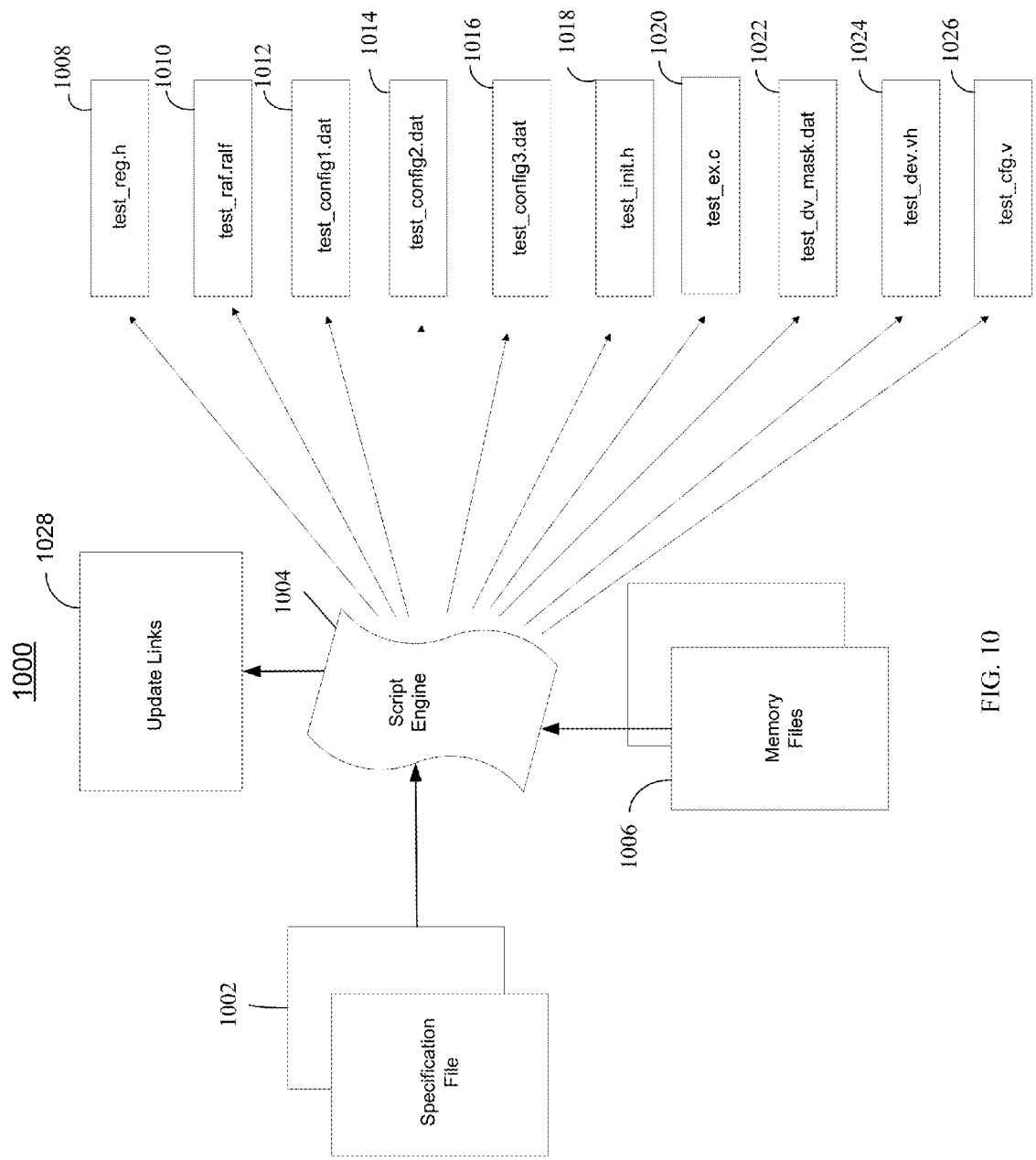
FIG. 10 shows an illustrative code generation engine in accordance with one embodiment of the present invention.

FIG. 4 shows a portion of an illustrative RTL file that was automatically generated in response to a user request to build the module. Code portion 400 may correspond to the beginning of the input/output (I/O) portion in the module code while code portion 410 may correspond to the logic portion in the module code. Code portions 400 and 410 may take the form of HDL code, such as Verilog or VHDL code, in some embodiments. In addition to RTL module and header code, other types of code, documentation, and programs may be automatically generated. For example, FIG. 10 shows the typical output files from building a module.

Both code portions 400 and 410 may include detailed comments and reference information. For example, comment data 402 and 412 both include an indication of the row number and control/monitor structure name from the configuration worksheet of the specification file. Comment data 402 and 412 may also include the text description of the control/monitor structure so that this portion of code is well-documented and easy for other programmers and designers to understand and use.

Interrupts and interrupt registers may also be supported by the specification file (e.g., specification file 100 of FIG. 1). In some embodiments, a series of registers and logic trees may be used to support multiple interrupts, while only a single interrupt is fed up to the host processor. Interrupts may be used to report errors or events to the host processor and may be used to report time-sensitive information. By supporting interrupts with the specification file, a consistent interface may be created for software while saving system designers from tedious work.

Figure 5:
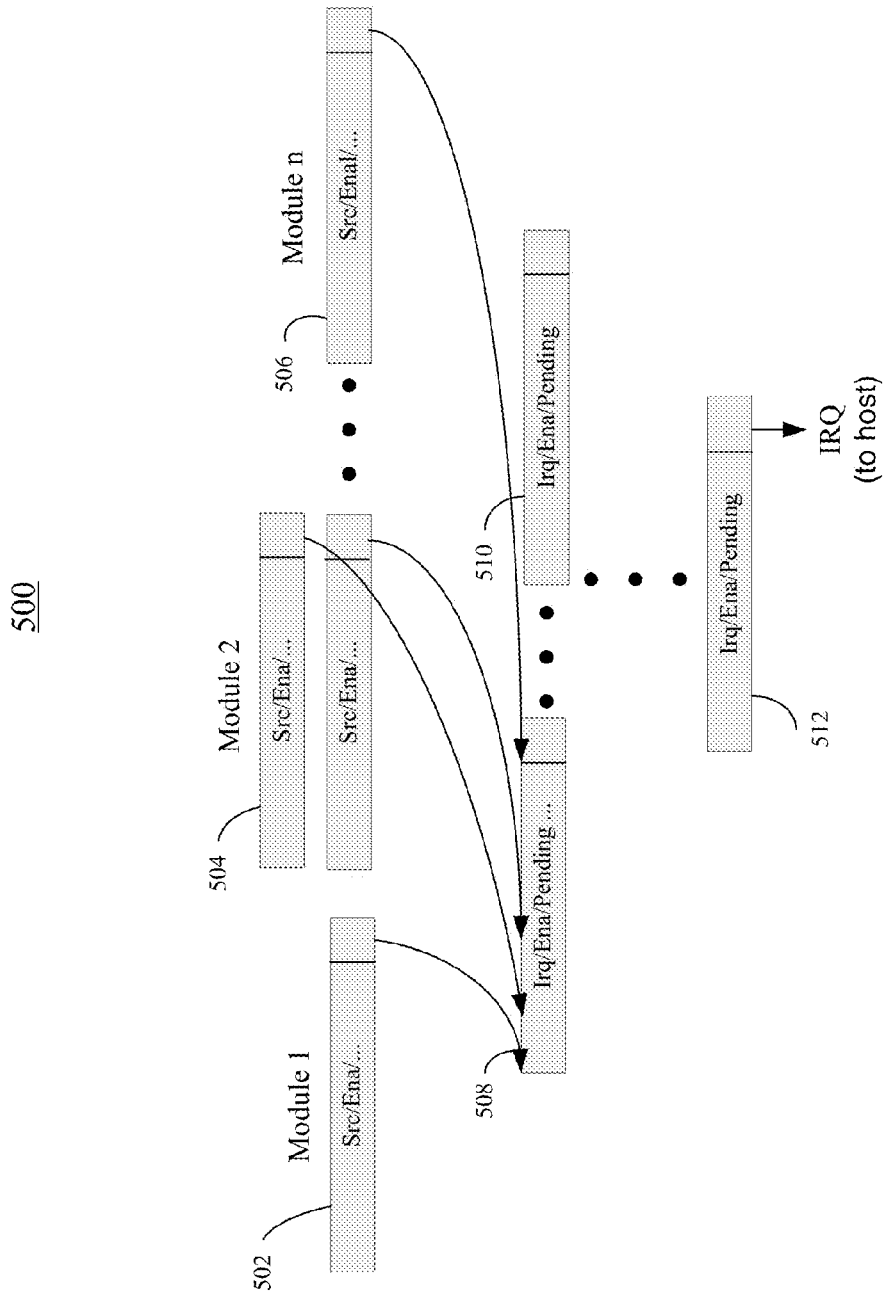
FIG. 5 shows an illustrative interrupt tree in accordance with one embodiment of the present invention.

FIG. 5 shows this approach in interrupt tree 500. Each module may be associated with one or more sets of lowest-level register interrupts. These lowest-level interrupts are shown at registers 502, 504, and 506 for module 1, module 2, and module N, respectively. As described in more detail with respect to FIGS. 6 and 8, the lowest-level interrupts may be associated with a set of registers, including a source register (e.g., "src"), a mask or enable register (e.g., "en"), a pending register (e.g., "pending"), a halt register (e.g., "halt"), and a force register (e.g., "force"). For each module in a specification file, there may be zero, one, or more IRQ output or outputs. The output or outputs may then be brought together and combined in registers 508 and 510 and brought up to the top of the register tree to send to the host processor at register 512. Registers 508 and 510 that combine the interrupts may appear in any module. Registers at all intermediate and top levels may include their own mask/enable flag, so the host processor has the option of turning off all interrupts in the system by writing to one register at this highest level.

Figure 6:
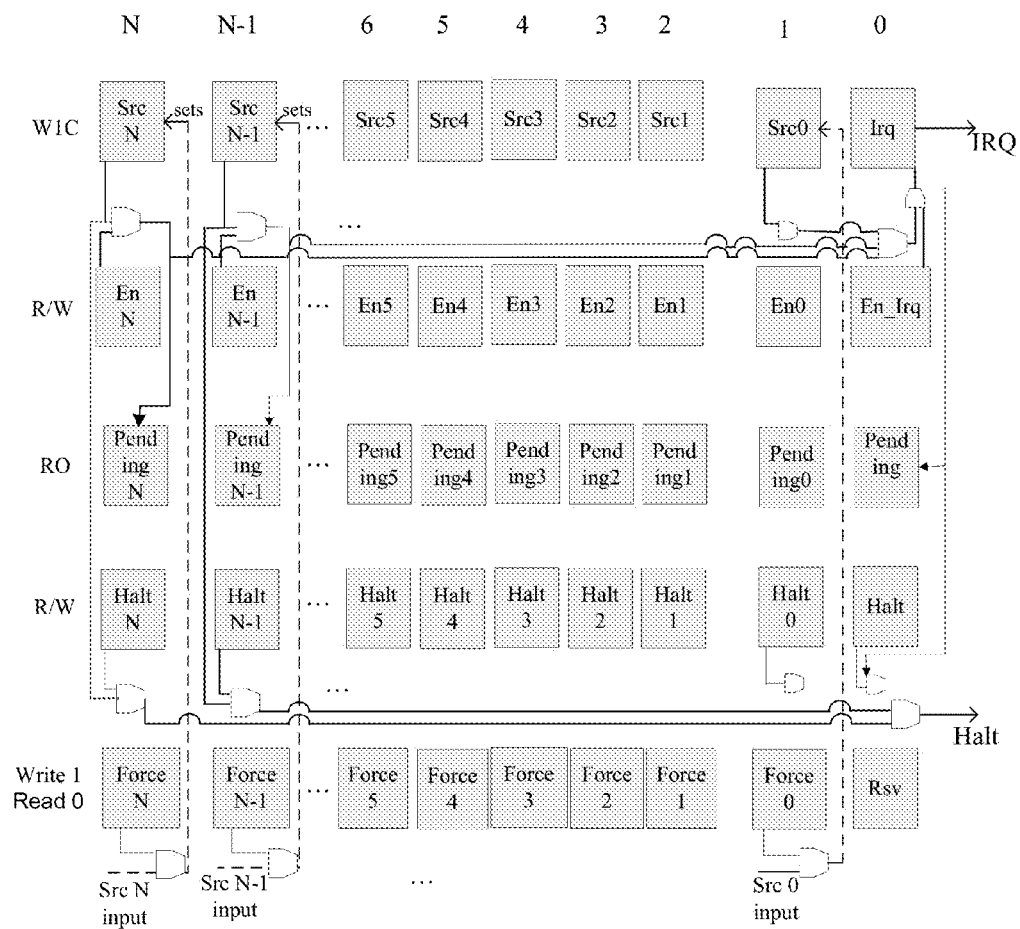
FIG. 6 shows the register logic for supporting interrupts in accordance with one embodiment of the present invention.

FIG. 6 shows register logic 600 for masking, combining, and testing interrupts at the lowest level. As can be seen from logic 600, registers at the lowest level may be associated with a set of registers, including a source register (e.g., "src"), a mask or enable register (e.g., "en"), a pending register (e.g., "pending"), a halt register (e.g., "halt"), and a force register (e.g., "force"). The source "src" register may include an input bit for each source defined in the configuration worksheet of the specification file. When the input is high, a register may be set. The register may be pulse or level triggered. The register may stay set until the host processor clears the register. A designer may verify that the input is low before it is cleared by the host processor or the source but may be set again. The host processor may clear the source bit by writing a '1' to that bit. The host processor, therefore, may read bits without affecting the bits and determine which bit or bits to clear. As shown in more detail in FIG. 8, bit 0 may be a Read-Only bit that shows the state of the IRQ from this block. For example, in some embodiments, bit 0 may be determined by AND'ing each source bit with its corresponding enable, then OR'ing the results together to form the IRQ for this register set. The source bits may not be affected by enable bits, allowing polling even if the IRQ is disabled. The source "src" register may be a required register if there are any interrupt sources.

The mask or enable "en" register may be used to mask the interrupt source. All interrupt sources may be maskable in some embodiments. A '0' for this bit may mask the source while a '1' may enable the source. The final IRQ may be masked regardless of individual enable bits. The mask or enable "en" register may be a required register. The "pending" register may include the result of AND'ing each source bit with its corresponding mask bit and may be provided as a read-only value in the pending register. This register may allow software to perform only a single read to access pending interrupts rather than reading both the source register and the enable register.

The "halt" register may be used for device debug and software testing. If a bit is set in this register and its corresponding bit is set in the source register, a "halt" output may be active. This signal may be used by the external hardware to preserve the current state. It may be used, for example, to hold state machine registers or hold other registers or counters so that software can probe the state of the block at the time of the event (e.g., for debugging).

The "force" register may be used for design verification and software testing. If any bit is set to '1', a pulse may be created that sets the source bit just as if the source bit were set from occurrence of the actual event (thus, a forced interrupt). At all other times, these bits may read '0'. Software may use the "force" register to test routines and to force certain events to occur. Bit 0 may be a reserved bit reading '0'.

Figure 7:
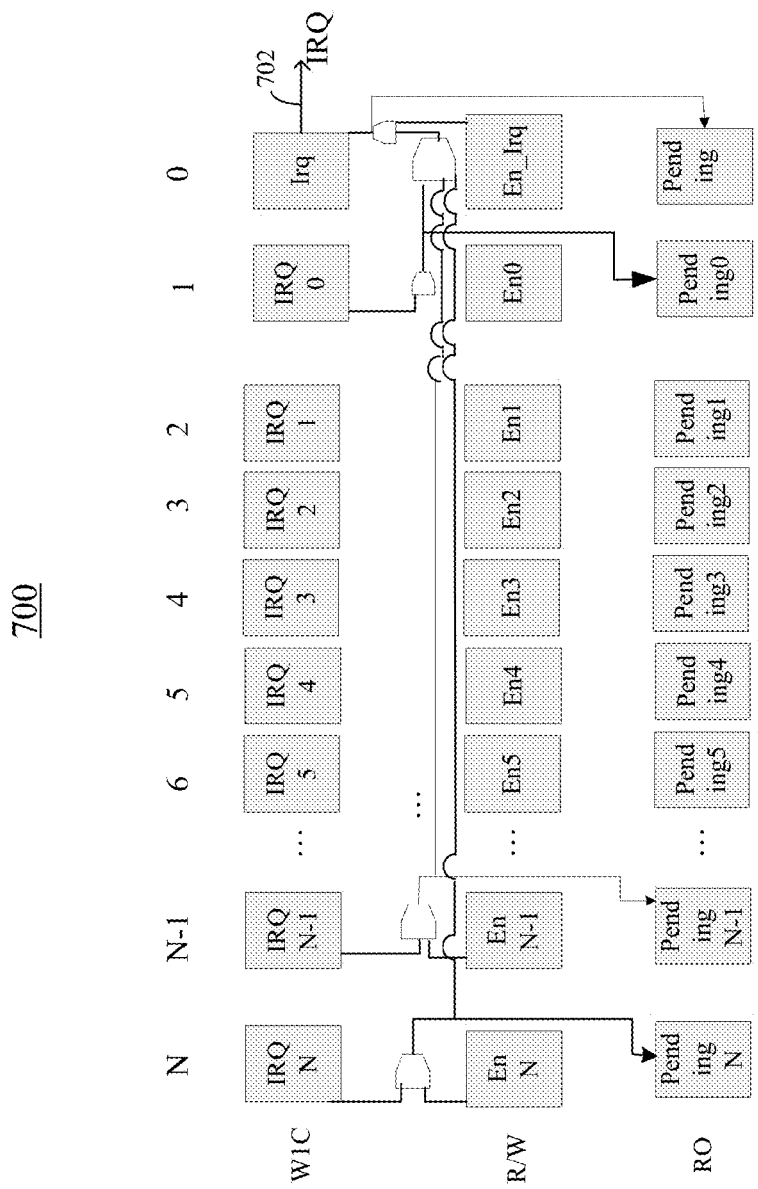
FIG. 7 shows the register logic for combining interrupts from the lowest level in accordance with one embodiment of the present invention.

FIG. 7 shows register logic 700 for combining interrupts from the lowest level. As previously discussed, interrupt source bits may be combined as required at intermediate levels of the interrupt tree so that a single interrupt is fed up to the host processor. This single interrupt may be fed to the host processor on line 702.

FIG. 8 shows a portion of data table 800 containing a lowest level interrupt. Table 800 may represent a portion of a configuration worksheet in a specification file (e.g., specification file 100 of FIG. 1) and may include all the same columns as table 200 of FIG. 2. As can be seen from the example of FIG. 8, the specification file may support interrupt registers in the same way as other control/monitor structures. One or more lowest lever register sets may be inserted using a template or macro (e.g., the "insert_IRQ_lowest" macro). Default values for each of the interrupt registers described above may then be automatically added to the configuration worksheet at the location of the cursor or selected cell. One or more higher lever register sets may also be inserted using a template or macro (e.g., the "insert_IRQ_high" macro).

Figure 9:
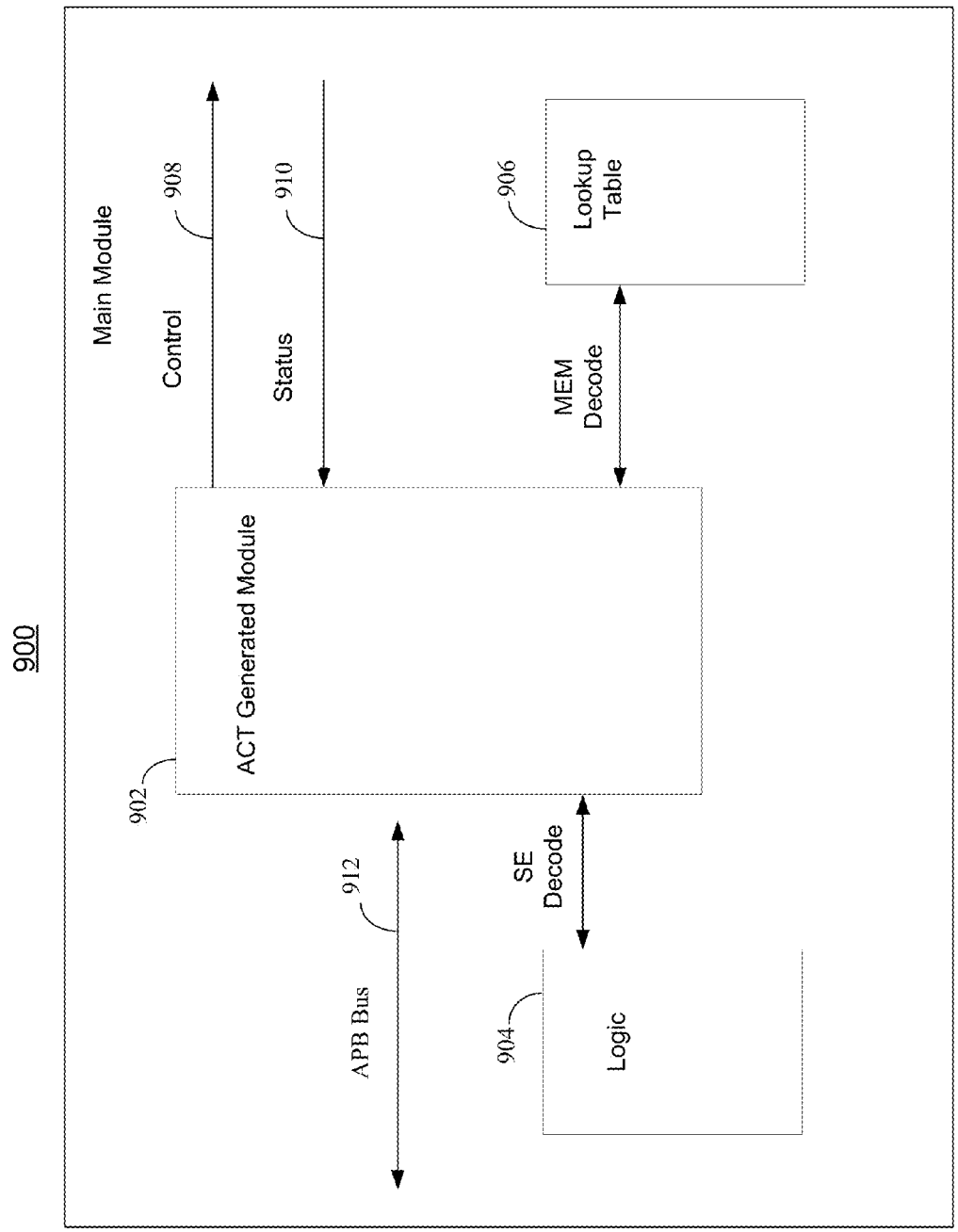
FIG. 9 is a simplified block diagram of the interface to a specification file generated module in accordance with one embodiment of the present invention.

FIG. 9 shows main module 900 of an ASIC or PLD. ACT generated module 902 may interface with main module 900 in several ways. First, in some embodiments, read and write cycles may be executed over an industry-standard bus architecture, such as an Advanced Microcontroller Bus Architecture (AMBA) peripheral bus (APB) 812. Control/monitor structures with "RW" access type fields may automatically generate internal flip-flop(s), while other access types may provide a read signal, a write signal, an input port, an output port, or a decode port for an external connection. Table 2 summarizes some of the available access types as well as the ports, signals, and flip-flop(s) provided or generated. For example, decode ports may be provided to logic 904 and lookup table 906 of main module 900 based on the access types contained in the configuration worksheet of the specification file (e.g., specification file 100 of FIG. 1). Control and status signals may be provided from and to ACT generated module 902, respectively, via lines 908 and 910. Additional ports, signals, and busses may be provided in other embodiments.

FIG. 10 shows scripting system 1000 for building modules and automatically generating RTL files, documentation, and software. Scripting engine 1004 may include any form of scripting engine or command-line interpreter, such as a Perl scripting engine. Scripting engine may read data from specification file 1002, such as register names, offset address values, default configurations, and description information in order to generate one or more output files 1008, 1010, 1012, 1014, 1016, 1018, 1020, 1022, 1024, and 1026. Scripting engine 1004 may also access memory files 1006 that contain memory initialization values for default configurations defined in specification file 1002.

Output files 1008-1026 show some typical files that may be automatically generated using scripting engine 1004. File 1008 may include one or more register mapping header files in any suitable programming language. For example, the register mapping header files may be outputted in C/C++, Java, Visual Basic, or any other programming language. File 1018 may be another software header file, this time including all the default configurations listed in the specification file 1002. For example, these default configurations may be specified in column 224 (FIG. 2). File 1020 may include an example software program that illustrates how to use header files 1008 and 1018 to access the registers and other control/monitor structures defined in specification file 1002. For example, file 1020 may include a program that simply outputs all the default configuration information contained in file 1018. Files 1008, 1018, and 1020 may correspond to the software component of output files 1008-1026.

Scripting engine 1004 may also output several RTL (and related) files. For example, file 1024 may include a Verilog header file used by file Verilog module file 1026, which may include a Verilog output template of the data included in specification file 1002. File 1010 may include the data in specification file 1002 in a format suitable for design verification or testing, such as a Synopsys Register Abstraction Layer (RAL) Format. File 1022 may include a mapping of each register access type (e.g., the access types specified in Table 2) included in specification file 1002 and may be used for system testing and design verification purposes. Files 1010, 1022, 1024, and 1026 may correspond to the data verification and testing component of output files 1008-1026.

Scripting engine 1004 may also output several data output files. For example, files 1012, 1014, and 1016 may include an output mapping of register address to data for each of the three illustrative default configurations specified in the example of specification file 1002. Files 1012, 1014, and 1016 may correspond to the three default operating modes or configurations for the module. As one example, different configuration settings may be applicable when a device is processing signals received from one transmission system as opposed to another transmission system. For example, signals may be received at different data rates, different frequencies, or with varying amounts of noise or interference. Different default configurations or modes may therefore be defined in specification file 1002 (e.g., starting in column 224 of FIG. 2) in order to process the various received signals form these transmission systems. The different configuration settings may correspond to different configuration values for various blocks or components of the device, including for example, various counters, timers, filters, gain control blocks, discrete Fourier transform blocks, phase estimators blocks, frame synchronization blocks, or any other blocks or components of the device.

Figure 11:
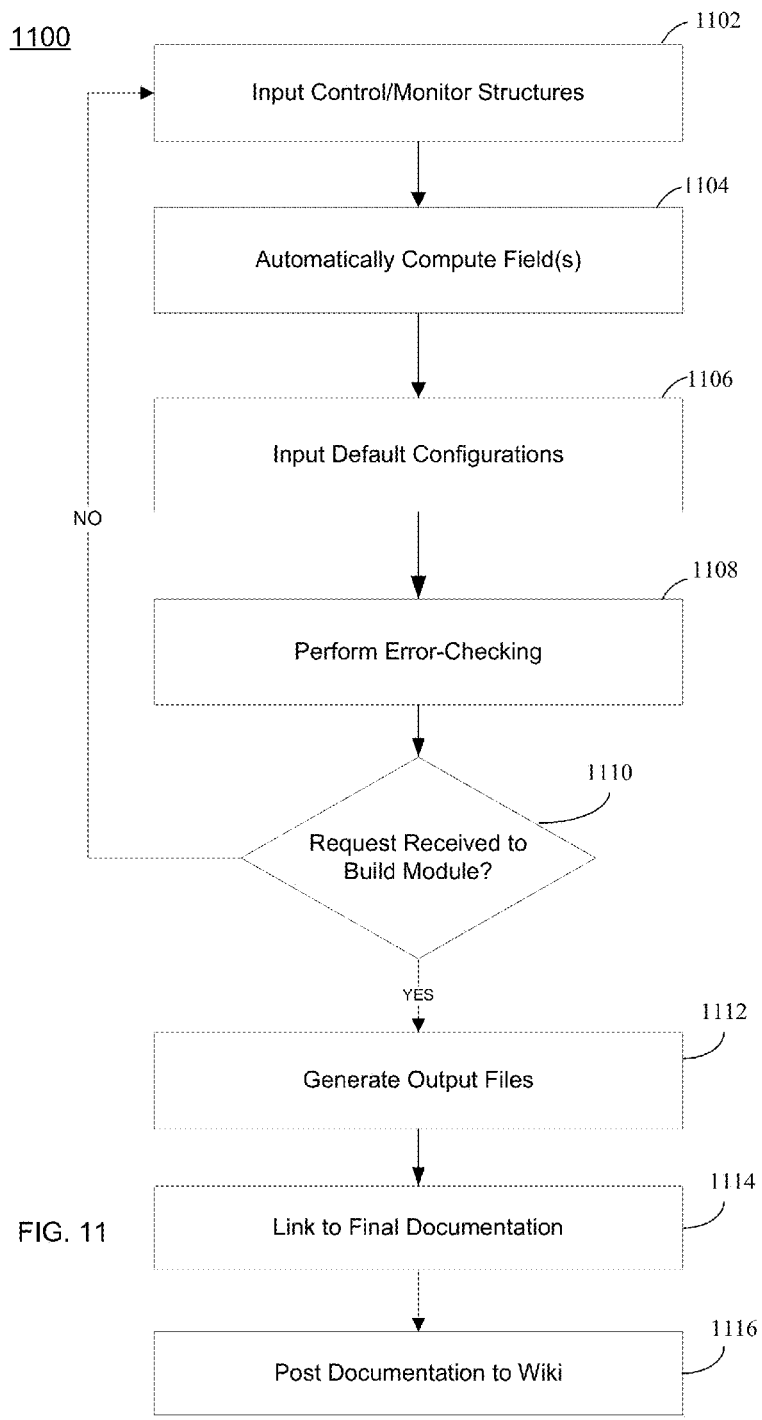
FIG. 11 shows a process for automated control/monitor code generation in accordance with one embodiment of the present invention.

FIG. 11 shows process 1100 for supporting a specification file in accordance with some embodiments of the present invention. At step 1102, a user may input one or more control/monitor structures into a specification file. For example, a user may input data relating to the one or more structures into table 200 (FIG. 2), table 800 (FIG. 8), or some other interface for receiving configuration information. The user input may include, for example, unique names for the control/monitor structures, one or more field names for each control/monitor structure, field bit counts, descriptions of the structures and/or fields, reset values, an access type for each field, and any other suitable configuration information.

After inputting some information about a control or monitor structure, other information about that structure (or related structures) may be automatically calculated and populated in the specification file at step 1104. For example, as described above, after a user inputs a field bit count into column 218 (FIG. 2), one or more of most significant bit column 208 (FIG. 2) and least significant bit column 210 (FIG. 2) may be automatically calculated and populated into the column for that structure or field. Equations may be tied to the cells in columns 208 and 210 (both of FIG. 2) so that these fields are automatically populated after a user inputs valid data in the corresponding row in field bit count column 218 (FIG. 2). As another example, offset column 202 (FIG. 2) may be automatically populated using the user-configurable minimum delta for memory address offsets, as described above, after a user inputs a new name for a structure in column 204 (FIG. 2). In some embodiments, a user may override an automatically populated field. For example, a user may override a field in automatically populated offset column 202 (FIG. 2) with a user-specified value (so long as the value is greater than the previous offset) in order, for example, to leave a gap in the memory address space between control/monitor structures.

At step 1106, one or more optional default configurations may be specified by the user. For example, a user may input data into column 224 (FIG. 2) and one or more subsequent columns in order to create one or more default configurations as described above. The default configurations may correspond to operating modes of the device in some embodiments and may be used to program the device. At step 1108, the user input may be automatically checked for consistency and input errors. For example, column 222 (FIG. 2) may indicate one or more errors applicable to a row or rows in the specification file. Common consistency and input errors may be automatically corrected. For example, conditional "if" statements may be tied to certain fields, rows, or columns in the specification file. If the conditional statement is satisfied (e.g., due to the entry of a common error), the specification file may automatically correct the error by, for example, substituting the incorrect user input with a correct value. Automatic error correction may be used for many types of common errors, including format and data entry errors, memory offset errors, and bit position errors.

In some embodiments, errors may be corrected and column 222 (FIG. 2) cleared before any module may be built or any code generated. In other embodiments, a user may issue a build command with active errors and the scripting engine may return anytime runtime, compile, parsing, or syntax errors. Some examples of common errors that may be reported within the specification file may include invalid or missing descriptions, too many field bits for a control/monitor structure, not enough field bits for a control/monitor structure, an invalid or missing memory depth, and an invalid or missing reset value.

At step 1110, a determination is made whether a request to build a module has been received. For example, a user may use a keyboard shortcut to execute a macro (e.g., the "build_modules" macro of Table 1) at step 1110. If a request to build a module has been received, then at step 1112 source and header files may be automatically generated. For example, one or more of one or more of Verilog module files 102 (FIG. 1), Verilog instantiation files 104 (FIG. 1), design verification files 106 (FIG. 1), Verilog headers 108 (FIG. 1), and software headers 110 (FIG. 1) may be automatically generated. In addition, one or more of output files 1008-1026 (FIG. 10) may be generated. These files may contain, for example, design verification code, software models or simulations, RTL code, and any other type of code or programming useful in designing, configuring, or testing the device (e.g., the ASIC or PLD). One or more of these automatically generated files may also include output mappings of register addresses to default configuration values for various fields of one or more control/monitor structures of a module. Some or all of the aforementioned files may be generated and saved locally to the host computer maintaining the specification file, generated locally and saved remotely to a network storage device or remote system (e.g., a computer system accessing the specification file over a network, such as the Internet), or generated and saved remotely from the host computer maintaining the specification file. In an illustrative approach, multiple users may access a specification file stored at a host computer. For example, one user may access the specification file via a web interface over the Internet while another user may access the specification file through a private intranet or network file system. Commands to build a module may be sent to the host system and executed locally at the host system. Depending on the user's preferences, the output files may be saved locally at the host system or delivered to the requesting system or device.

At step 1112, a scripting engine may be used to generate at least part of the output files. For example, scripting engine 1004 (FIG. 10) may execute a script or a series of scripts (e.g., Perl scripts) using at least some of the data in a specification file (e.g., specification file 1002 of FIG. 10) in order to generate the output files. For example, as described above, one or more of the output files may include detailed documentation in the form of automatically generated comments derived from various types of information included in the specification file, such as offset information, description information, module and field name information, field length information, and default configuration information. For example, each default configuration specified in the specification file may be associated with a corresponding initialization function or structure in the output code (e.g., HDL code), program (e.g., C/C++ program), or both. Each initialization function may include a comment header including the name of the default configuration, a description pulled from the specification file, and other information useful for a programmer or designer to use the default configuration. In addition, the configuration settings associated with each defined default configuration may be automatically loaded into a vector or array of values.

In some embodiments, at step 1112 some or all of the generated code may follow or track the order of the specification file from which the code was generated. For example, the code may be generated in the order the control/monitor structures are presented in the specification file, row by row. Appropriate input ports, output ports, read signals, write signals flip-flop(s), and side effects may be created in the automatically generated code, depending, for example, on the assigned access type of each field. By following the order of the specification file, the generated code may be easier to debug and referencing the specification file from the generated code may be facilitated.

At step 1114, links may be automatically added to documentation to reflect the new build. For example, links to portions of the specification file may be added to programmer's manual 112 (FIG. 1) and hardware specifications 114 (FIG. 1), if the links do not already exist. In some embodiments, an anchor tag is inserted into the documentation files, and the link is updated each time a new build is generated. In other embodiments, a static link to the most current build of the specification file is inserted to the documentation. A user may activate the link to access the most current version of the specification file or a relevant portion thereof.

In some embodiments, links are inserted into the specification file itself to external documentation as an additional reference. For example, the configuration worksheet of specification file 100 (FIG. 1) may include hyperlinks to programmer's manual 112 (FIG. 1), hardware specification 114 (FIG. 1), or both. In this way, users of the specification file may have easy access to external documentation that may be of interest while inputting data into the specification file.

At step 1116, documentation may be automatically posted to a corporate wiki or bulletin board. In some embodiments, the documentation itself in which links were inserted or updated at step 1114 may be posted to the corporate wiki or bulletin board (e.g., either as an attachment, formatted HTML, rich text, or any other supported format). In some embodiments, a link (e.g., a hyperlink) to the documentation in which links were inserted or updated at step 1114 may be posted. A user may activate a link from the corporate wiki or bulletin board to access the desired documentation. In this way, a system designer or programmer may easily access up-to-date documentation from a corporate bulletin board or wiki location and quickly link to useful information, such as documentation, the most current build of the specification file, and hardware specifications.

In practice, one or more steps shown in process 1100 may be combined with other steps, performed in any suitable order, performed in parallel (e.g., simultaneously or substantially simultaneously), or removed.

In some embodiments, a computer-readable medium containing computer-readable instructions recorded thereon is provided. For example, specification file 100 (FIG. 1) may take the form of a computer program product accessible from a computer-usable or computer-readable medium providing program code for use by or in connection with a computer or any instruction execution system. For the purposes of this description, a computer-usable or computer-readable medium may include any tangible medium or apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks may include compact disc read-only memory (CD-ROM), a rewritable compact disc (CD-R/W), and digital video disc (DVD).

A data processing system is suitable for storing and/or executing program code will include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) may be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

Having described several embodiments, it will be recognized by those of skill in the art that various modifications, alternative constructions, and equivalents may be used without departing from the spirit of the invention. For example, the above elements may be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A method for generating output files for programming a device, the method comprising:
   receiving, at a computer system, a first user input defining a first programmable structure of the device, the first user input comprising at least one of a structure identifier and a structure description;
   receiving, at the computer system, a second user input defining a field of the first programmable structure and at least one default configuration value for the field;
   receiving, at the computer system, a third user input defining an access type for the field;
   receiving, at the computer system, a request to build a module comprising the first programmable structure; and
   in response to receiving the request to build the module:
   automatically generating, at the computer system, at least one register transfer level (RTL) file based at least in part on the first user input, the second user input, and the third user input, automatically generating, at the computer system, an output mapping of register address to default configuration value for the field of the first programmable structure, automatically generating, at the computer system, at least one header file comprising the output mapping of the register address to the default configuration value for the field of the first programmable structure, and automatically generating, at the computer system, at least one design verification file based at least in part on the first user input, the second user input, and the third user input.

2. The method of claim 1 further comprising:

receiving a fourth user input defining a second programmable structure of the device, wherein the first programmable structure is different than the second programmable structure; and automatically generating an address offset for the second programmable structure based at least in part on an address offset of the first programmable structure.

3. The method of claim 1 further comprising, in response to receiving the second user input, automatically computing at least one of a least significant bit for the field and a most significant bit for the field.

4. The method of claim 1 further comprising, in response to receiving the request to build the module, automatically generating a sample software program.

5. The method of claim 4 wherein the sample software program is configured to automatically output the at least one default configuration value for the field.

6. The method of claim 1 wherein the at least one default configuration value for the field comprises at least two default configuration values for the field, wherein each of the at least two default configuration values corresponds to a different mode of operation of the device.

7. The method of claim 1 wherein receiving a request to build a module comprises receiving a macro execution command.

8. The method of claim 1 wherein automatically generating at least one register transfer level (RTL) file comprises automatically generating a Verilog module file and a Verilog instantiation file.

9. The method of claim 1 wherein the access type for the field comprises a read/write access type, the method further comprising, in response to receiving the request to build the module, both:

automatically creating at least one internally generated flip-flop; and automatically creating an output port to output the value stored by the at least one internally generated flip-flop.

10. The method of claim 1 wherein the first programmable structure of the device comprises a configuration register.

11. The method of claim 1 further comprising, in response to receiving the request to build the module, automatically programming the device to support the default configuration using the output mapping.

12. A system comprising:

at least one register transfer level (RTL) file; and a specification file configured to:

receive a first user input defining a first programmable structure of a device, the first user input comprising at least one of a structure identifier and a structure description;

receive a second user input defining a field of the first programmable structure and at least one default configuration value for the field;

receive a third user input defining an access type for the field;

receive a request to build a module comprising the first programmable structure; and in response to receiving the request to build the module:

automatically generate the at least one register transfer level (RTL) file based at least in part on the first user input, the second user input, and the third user input, automatically generate an output mapping of register address to default configuration value for the field of the first programmable structure, automatically generate at least one header file comprising the output mapping of the register address to the default configuration value for the field of the first programmable structure, and automatically generate at least one design verification file based at least in part on the first user input, the second user input, and the third user input.

13. The system of claim 12 wherein the specification file is configured to:

receive a fourth user input defining a second programmable structure of the device, wherein the first programmable structure is different than the second programmable structure; and automatically generate an address offset for the second programmable structure based at least in part on an address offset of the first programmable structure.

14. The system of claim 12 wherein the specification file is configured to automatically compute at least one of a least significant bit for the field and a most significant bit for the field in response to receiving the second user input.

15. The system of claim 12 wherein the specification file is configured to automatically generate a sample software program in response to receiving the request to build the module.

16. The system of claim 15 wherein the sample software program is configured to automatically output the at least one default configuration value for the field.

17. The system of claim 12 wherein the at least one default configuration value for the field comprises at least two default configuration values for the field, wherein each of the at least two default configuration values corresponds to a different mode of operation of the device.

18. The system of claim 12 wherein the specification file is configured to receive a request to build a module by receiving a macro execution command.

19. The system of claim 12 wherein the specification file is configured to automatically generate the at least one register transfer level (RTL) file by automatically generating a Verilog module file and a Verilog instantiation file.

20. The system of claim 12 wherein the access type for the field comprises a read/write access type, the specification file configured, in response to receiving the request to build the module, to both:

automatically create at least one internally generated flip-flop; and automatically create an output port to output the value stored by the at least one internally generated flip-flop.

21. The system of claim 12 wherein the first programmable structure of the device comprises a configuration register.

22. The system of claim 12 wherein the specification file is configured to, in response to receiving the request to build the module, automatically program the device to support the default configuration using the output mapping.

23. A non-transitory computer-readable medium comprising computer-readable program instructions recorded thereon for:
- receiving a first user input defining a first programmable structure of a device, the first user input comprising at least one of a structure identifier and a structure description;
- receiving a second user input defining a field of the first programmable structure and at least one default configuration value for the field;
- receiving a third user input defining an access type for the field;
- receiving a request to build a module comprising the first programmable structure; and
- in response to receiving the request to build the module:
  - automatically generating at least one register transfer level (RTL) file based at least in part on the first user input, the second user input, and the third user input,
  - automatically generating an output mapping of register address to default configuration value for the field of the first programmable structure,
  - automatically generating at least one header file comprising the output mapping of the register address to the default configuration value for the field of the first programmable structure, and
  - automatically generating at least one design verification file based at least in part on the first user input, the second user input, and the third user input.

* * * * *